United States Patent
Iwakiri et al.

(10) Patent No.: US 7,749,610 B2
(45) Date of Patent: Jul. 6, 2010

(54) COPPER FOIL AND METHOD OF MANUFACTURING THE SAME

(75) Inventors: Kenichiro Iwakiri, Ageo (JP); Seiji Nagatani, Ageo (JP)

(73) Assignee: Mitsui Mining & Smelting Co., Ltd., Tokyo (JP)

( * ) Notice: Subject to any disclaimer, the term of this patent is extended or adjusted under 35 U.S.C. 154(b) by 844 days.

(21) Appl. No.: 11/547,517

(22) PCT Filed: Mar. 31, 2005

(86) PCT No.: PCT/JP2005/006293

§ 371 (c)(1),
(2), (4) Date: Jan. 11, 2007

(87) PCT Pub. No.: WO2005/095677

PCT Pub. Date: Oct. 13, 2005

(65) Prior Publication Data

US 2008/0280159 A1 Nov. 13, 2008

(30) Foreign Application Priority Data

Apr. 2, 2004 (JP) .............................. 2004-110485

(51) Int. Cl.
*B32B 15/20* (2006.01)
*C25D 7/06* (2006.01)
*C25D 3/38* (2006.01)
*H05K 1/09* (2006.01)

(52) U.S. Cl. ...................... 428/607; 428/626; 428/675; 428/687; 205/111; 205/296

(58) Field of Classification Search ........................ None
See application file for complete search history.

(56) References Cited

U.S. PATENT DOCUMENTS

| 5,482,784 | A | 1/1996 | Ohara et al. | |
| 6,531,045 | B2 * | 3/2003 | Mitsuhashi et al. | ......... 205/176 |
| 6,585,877 | B2 | 7/2003 | Mitsuhashi | |

FOREIGN PATENT DOCUMENTS

| JP | 55-30818 | * | 3/1980 |
| JP | 7-231152 | A | 8/1995 |
| JP | 10-341066 | A | 12/1998 |
| JP | 11-340595 | A | 12/1999 |
| JP | 2001-214297 | A | 8/2001 |

* cited by examiner

*Primary Examiner*—John J Zimmerman
(74) *Attorney, Agent, or Firm*—Greenblum & Bernstein, P.L.C.

(57) ABSTRACT

The object is to provide copper foil of high adhesion even when the roughness $R_z$ of a nodular surface of the copper foil is low, and a method of manufacturing the copper foil. To achieve this object, there is adopted a copper foil which is characterized in that an area coefficient C(S), which is defined by A(S)/B(S) from a three-dimensional surface area A(S), which is obtained by performing three-dimensional measurement of a surface area of a nodular surface of a copper foil sample S under a laser microscope, and from a measuring region area B(S), which is an area of a measuring region of the three-dimensional surface area A(S), and a roughness $R_z(S)$ of a nodular surface of the copper foil sample S, which is measured by a stylus-type roughness meter, have a relationship of equation (1) below, and in that the roughness $R_z(S)$ is 1.0 μm to 3.0 μm, $$0.5 \times R_z(S) + 0.5 \leq C(S) \quad (1)$$

where $R_z(S)$ is a numerical value represented by μm.

3 Claims, 2 Drawing Sheets

COPPER FOIL AND METHOD OF MANUFACTURING THE SAME

CROSS REFERENCE TO RELATED APPLICATION

This application is a 35 USC §371 National Phase Entry Application from PCT/JP2005/006293, filed Mar. 31, 2005, and designating the United States.

TECHNICAL FIELD

The present invention relates to copper foil and a method of manufacturing the copper foil.

BACKGROUND ART

Copper foil is widely used as a material for forming printed wiring boards. A printed wiring board is obtained from bonding copper foil and other kinds of materials, such as a pre-preg. SO, higher adhesion is required between copper foil and a pre-preg or the like.

As one of the methods for increasing the adhesion between copper foil and a pre-preg or the like, nodules are formed to have a roughness $R_z$ of several micrometers when measured by a stylus-type roughness meter, for example. As such, a matte surface and/or a shiny surface of untreated copper foil is subjected to nodular treatment to have a nodular surface, whereby surface-treated copper foil is formed from the untreated copper foil. Then the anchoring effect of the nodular surface on a pre-preg or the like is performed. And the anchoring effect is caused by the embedding of nodules in a pre-preg or the like. So, it is generally understood that the adhesion between a nodular surface of copper foil and a pre-preg or the like increases with an increase in the size of nodules on the copper foil, and eventually with the above-described roughness $R_z$ of a nodular surface. For this reason, to estimate the adhesion between a nodular surface of copper foil and a pre-preg or the like, the degree of nodular treatment has hitherto been evaluated by the roughness $R_z$ measured by a stylus-type roughness mater and the like as specified in IPC TM650 Section 2.2.17A. Then the adhesion between a nodular surface of copper foil and a pre-preg or the like has been estimated by this roughness $R_z$ and the like.

However, depending on the shape of nodules on a nodular surface of copper foil after nodular treatment, there is sometime miss matching in relationship within an increase in the roughness $R_z$ measured by the above-described stylus-type roughness meter and an increase in the adhesion of the above-described nodular surface of copper foil. That is, even when the roughness $R_z$ measured by a stylus-type roughness meter on a nodular surface of copper foil is substantially at the same level in surface-treated copper foil, when the shape of nodules and the like are different, the adhesion is not substantially at the same level and variations are found in the adhesion.

Incidentally, it is required on recent printed wiring boards, especially in multilayer printed wiring boards to be thinner than ever. For this reason, also for copper foil which is a material for printed wiring boards, thinner surface-treated copper foil is required and besides, smaller nodules on a nodular surface of the copper foil, that is, lower the above-described roughness $R_z$. For example, when the above-described roughness $R_z$ of a nodular surface of surface-treated copper foil caused by higher nodular treatment, it is not recommended because it worsen both the electric properties of a circuit formed from this copper foils and the formability of fine circuits.

However, as described above, the adhesion of a nodular surface of copper foil may sometimes show variations even when the roughness $R_z$ measured by a stylus-type roughness meter is substantially at the same level. Therefore, it has been necessary to set the minimum value of the above-described roughness $R_z$ of a nodular surface of copper foil at somewhat high levels when importance is attached to ensuring a prescribed adhesion. This is the reason why the above-described roughness $R_z$ of a nodular surface of copper foil cannot be set at very low levels.

In this connection, Patent Document 1 (Japanese Patent Laid-Open No. H10-265991) discloses a plated material excellent in resin adhesion, in which a coating layer of Cu and the like is formed on the surface of a metal sheet. This coated material is such that when the surface of the coated material is measured in magnification of 3000 times by an electron beam three-dimensional roughness analyzer, the arithmetic average roughness (Ra) is 0.03 to 0.5 μm and the surface-area alternative value which is defined as (surface area of a sample obtained from measurement)/(measured area in two dimension) is 1.01 to 1.1. In this invention, the problem to be solved is to supply a metal material which has adhesion to resin by keeping the arithmetic average roughness (Ra) and the surface-area alternative value in appropriate ranges.

[Patent Document 1]: Japanese Patent Laid-Open No. H10-265991 (page 2, first column)

DISCLOSURE OF THE INVENTION

However, in the method of Patent Document 1, as is apparent from Table 1 described in paragraph number [0020], resin adhesion does not increase with increasing arithmetic average roughness (Ra). So, it is impossible to estimate the value of resin adhesion with good accuracy by only measuring arithmetic average roughness (Ra) of the surface of copper foil. This table 1 does not show the tendency that resin adhesion always increases with increasing surface-area alternative value, and it is impossible to estimate the value of resin adhesion with good accuracy by only measuring the surface-area alternative value of the surface of copper foil. For this reason, it is impossible to estimate the value of adhesion of the surface of the copper foil with good accuracy by only measuring the arithmetic average roughness (Ra) of the surface of the copper foil and the surface-area alternative value. So, it is impossible to require the roughness of the nodular surface of the copper foil to very low values in consideration of variations in adhesion. As a result, this has posed the problem that it is impossible to obtain surface-treated copper foil having low roughness with high adhesion.

Therefore, the object of the present invention is to provide copper foil of high adhesion even when the roughness $R_z$ of a nodular surface of the copper foil is low.

Under such circumstances, the present inventors devoted themselves to investigations and as a result, they found out when an area coefficient C(S), which is calculated by A(S)/B(S), wherein A(S) is a three-dimensional surface area and B(S) is a measuring region area, which are obtained by performing three-dimensional measurement of a surface area of a nodular surface of a copper foil sample S under a laser microscope. When both of C(S) and a roughness $R_z$(S), which is measured by a stylus-type roughness meter on a nodular surface of the copper foil sample S are within specific ranges, copper foil shows high adhesion even when the roughness $R_z$ is low. And eventually, they completed the present invention.

That is, the present invention provides a copper foil which is characterized in that when an area coefficient C(S) and a roughness $R_z(S)$ on the nodular surface of the copper foil sample S have a relationship of equation (1) below and in that the roughness $R_z(S)$ is in the range of 1.0 μm to 3.0 μm.

[Formula 2]

$$0.5 \times R_z(S) + 0.5 \leq C(S) \qquad (1)$$

(where $R_z(S)$ is a numerical value represented by μm.)

The present invention provides a copper foil in which the copper foil S is a copper foil having a thickness of not more than 18 μm.

Also, the present invention provides a method of manufacturing copper foil which is characterized in that first-stage nodular treatment which involves forming copper micro-particles on the matte surface of the untreated copper foil is provided on the untreated copper foil in following conditions.

Untreated copper foil: roughness $R_z$ of a matte surface of 1.0 μm to 5.0 μm as measured by a stylus-type roughness meter Treatment solution for nodular treatment: Cu (II) ion concentrations of in the range from 5 g/l to 20 g/l, free $SO_4^{2-}$ ion concentrations of in the range from 30 g/l to 100 g/l, 9-phenylacridine concentrations of in the range from 100 mg/l to 200 mg/l and Cl ion concentrations of in the range from 20 mg/l to 100 mg/l.

Solution temperature: 20° C. to 40° C.

Condition for electrolysis: for first stage, current densities of in the range from 15 A/dm² to 30 A/dm² for 2 seconds to 10 seconds, and for second-stage, current densities of in the range from 3 A/dm² to 10 A/dm² for 2 seconds to 10 seconds.

The copper foil related to the present invention is a copper foil of high adhesion although it has a low roughness $R_z$. The manufacturing method of the copper foil related to the present invention enable production of the copper foil related to the present invention with good efficiency.

BEST MODE FOR CARRYING OUT THE INVENTION (Copper Foil Related to the Present Invention)

The copper foil related to the present invention is surface-treated copper foil which is obtained as a copper foil sample S is one which was subjected to nodular treatment which involves nodular treatment of a matte surface and/or a shiny surface on untreated copper foil. This surface-treated copper foil may be either electro-deposited copper foil or rolled copper foil.

The copper foil related to the present invention usually has thicknesses of not more than 18 μm, preferably in the range from 12 μm to 18 μm. When the copper foil thickness is in the range, this is recommended because it can help designs of printed wiring boards thinner.

In the copper foil related to the present invention, an area coefficient $C(S)$ and a roughness $R_z(S)$ on the nodular surface of the copper foil sample S have a relationship of equation (1) shown below, preferably a relationship of equation (2) shown below, and more preferably a relationship of equation (3) shown below.

As a laser microscope used in the present invention is not especially limited. Any laser microscope capable of three-dimensional analyses can be used so long as it can measure the three-dimensional surface area $A(S)$ and the measuring region area $B(S)$, which will be described later. As a laser used in this laser microscope, it is recommended to use violet laser having visible-light threshold wavelengths of 405 nm to 410 nm because the area coefficient $C(S)$ is easily measured with good accuracy.

In the present invention, the three-dimensional surface area $A(S)$ refers to a surface area obtained by three-dimensionally measuring on a nodular surface of a copper foil sample S, which is present in a measuring region under a laser microscope. Concretely, this surface area refers to a surface area including asperities on a nodular surface of the copper foil sample S, which is obtained by moving the lens of the laser microscope along the Z-axis direction for focusing. Incidentally, in the present invention, the three-dimensional surface area $A(S)$ represents the three-dimensional surface area A determined for the copper foil sample S. Although the shape of the above-described measuring region is not especially limited, it is possible to be a quadrate, a rectangle and the like.

In the present invention, the measuring region area $B(S)$ refers to the two-dimensional area of the above-described measuring region of the three-dimensional surface area $A(S)$, and the measuring region area $B(S)$ represents the measuring region area B determined for the copper foil sample S.

In the copper foil related to the present invention, an area coefficient $C(S)$ and a roughness $R_z(S)$ on the nodular surface of the copper foil sample S have a relationship of equation (1) shown below, preferably a relationship of equation (2) shown below, and more preferably a relationship of equation (3) shown below. In terms of the properties of the copper foil, the relationship given by equation (1) is preferable to the relationship given by equation (2) and the relationship given by equation (2) is preferable to the relationship given by equation (3). However, in consideration of the agreement of the area given by these equations with the range in which plots of copper foil are present, the relationship given by equation (2) is preferable to the relationship given by equation (1) and the relationship given by equation (3) is preferable to the relationship given by equation (2). Incidentally, because the three-dimensional surface area $A(S)$ never shows smaller value than the measuring region area $B(S)$, the area coefficient $C(S)$ takes numerical values of not less than 1. In the present invention, the area coefficient $C(S)$ represents the area coefficient $C(S)$ determined for the copper foil sample S. In this specification, the roughness $R_z$ measured by a stylus-type roughness meter refers to a value measured by a stylus-type roughness meter which uses a stylus, the tip of which is a diamond cone having a spherical top of 2 μm in diameter. In the present invention, the roughness $R_z(S)$ represents the roughness $R_z$ measured by a stylus-type roughness meter in the copper foil sample S.

Incidentally, in the present invention, for convenience of explanation, the left side $(0.5 \times R_z(S) + 0.5)$ of equation (1) below is called also the roughness coefficient $D_1(S)$, the right side $(0.5 R_z(S) + 1.0)$ of equation (2) below is called also the roughness coefficient $D_2(S)$, and the right side $(0.5 \times R_z(S) + 0.7)$ of equation (3) below is called also the roughness coefficient $D_3(S)$. That is, in the copper foil related to the present invention, the area coefficient $C(S)$ is not less than the roughness coefficient $D_1(S)$, preferably not less than the roughness coefficient $D_1(S)$ but not more than the roughness coefficient $D_2(S)$, and more preferably not less than the roughness coefficient $D_1(S)$ but not more than the roughness coefficient $D_3(S)$.

[Formula 3]

$$0.5 \times R_z(S) + 0.5 \leq C(S) \qquad (1)$$

(where $R_z(S)$ is a numerical value represented by μm.)

[Formula 4]

$$0.5 \times R_z(S) + 0.5 \leq C(S) \leq 0.5 \times R_z(S) + 1.0 \qquad (2)$$

[Formula 5]

$$0.5 \times R_z(S) + 0.5 \leq C(S) \leq 0.5 \times R_z(S) + 0.7 \quad (3)$$

(where $R_z(S)$ is a numerical value represented by μm.)

Equations (1) to (3) above will be described here. First, when the relationship is expressed in a graph, with the ordinate representing $C(S)$ and the abscissa representing $R_z(S)$, equation (1) above shows a region which has equation (4) below as a minimum in which the inclination of $R_z(S)$ with respect to $C(S)$ is 0.5 and the intercept is 0.5. Incidentally, a straight line represented by equation (4) below is indicated by the symbol C in FIG. 3. The above-described region having equation (4) below as a minimum is indicated by the symbol D in FIG. 1.

[Formula 6]

$$0.5 \times R_z(S) + 0.5 = C(S) \quad (4)$$

(where $R_z(S)$ is a numerical value represented by μm.)

Similarly, equation (2) above shows a region which has equation (4) above as a minimum and equation (5) below as a maximum in which the inclination of $R_z(S)$ with respect to $C(S)$ is 0.5 and the intercept is 1.0, and equation (3) above shows a region which has equation (4) above as a minimum and equation (6) below as a maximum in which the inclination of $R_z(S)$ with respect to $C(S)$ is 0.5 and the intercept is 0.7.

[Formula 7]

$$0.5 \times R_z(S) + 1.0 = C(S) \quad (5)$$

(where $R_z(S)$ is a numerical value represented by μm.)

[Formula 8]

$$0.5 \times R_z(S) + 0.7 = C(S) \quad (6)$$

(where $R_z(S)$ is a numerical value represented by μm.)

In the copper foil related to the present invention, the above-described roughness $R_z$ of a nodular treated surface measured by use of a stylus-type roughness meter is in the range from 1.0 μm to 3.0 μm, preferably in the range from 1.5 μm to 2.5 μm, and more preferably in the range from 2.0 μm to 2.5 μm. When the roughness $R_z$ is in these ranges, this is recommended because it may hardly worsen the electrical properties of circuits and formability of fine circuits.

The copper foil related to the present invention can be manufactured by using, for example, the manufacturing method of the copper foil related to the present invention, which will be described below.

(Manufacturing Method of Copper Foil Related to the Present Invention)

In the manufacturing method of the copper foil related to the present invention, a first-stage nodular treatment which involves using untreated copper foil and performing nodular treatment by forming copper micro-particles on the matte surface side of the untreated copper foil under specific conditions.

In the present invention, the copper foil subjected to the nodular treatment is an untreated copper foil in which the roughness $R_z$ of a matte surface measured by use of a stylus-type roughness meter is usually in the range from 1.0 μm to 5.0 μm, preferably in the range from 2.0 μm to 4.0 μm.

In the present invention, a first-stage nodular treatment which involves performing a nodular treatment by forming copper micro-particles on the surface of the matte surface side of the untreated copper foil, and this first-stage nodular treatment is performed by using a specific first-stage nodular treatment solution.

In the first-stage nodular treatment solution used in the present invention, the Cu (II) ion concentration is usually in the range from 5 g/l to 20 g/l, preferably in the range from 6 g/l to 12 g/l.

In the first-stage nodular treatment solution used in the present invention, the free $SO_4^{2-}$ ion concentration is usually in the range from 30 g/l to 100 g/l, preferably in the range from 40 g/l to 60 g/l. Incidentally, in the present invention, the free $SO_4^{2-}$ ion concentration means an $SO_4^{2-}$ ion concentration which remains after the subtraction of the $SO_4^{2-}$ ion concentration which is equivalent to Cu (II) ion concentration forming $CuSO_4$ in the solution from the total $SO_4^{2-}$ ion concentration in the solution.

In the first-stage nodular treatment solution used in the present invention, the 9-phenylacridine concentration is usually in the range from 100 mg/l to 200 mg/l, preferably in the range from 120 mg/l to 180 mg/l.

In the first-stage nodular treatment solution used in the present invention, the Cl ion concentration is usually in the range from 20 mg/l to 100 mg/l, preferably in the range from 40 mg/l to 60 mg/l.

In the present invention, the first-stage nodular treatment is performed in such a manner that electrolysis is performed by using the above-described first-stage nodular treatment solution. A matte surface of an untreated copper foil is served as a cathode, the CU (II) ions in the first-stage nodular treatment solution are electro-deposited and copper micro-particles are formed on the surface on the matte surface side of the untreated copper foil, whereby the matte surface of the untreated copper foil is subjected to the nodular treatment.

In the present invention, the first-stage nodular treatment is such that in the above-described first-stage nodular treatment solution, a first-stage, preceding-step nodular treatment during the first-stage nodular treatment and a first-stage, succeeding-step nodular treatment during the first-stage nodular treatment are performed in succession. The first-stage, preceding-step nodular treatment is a first-stage nodular treatment which is first performed during the first-stage nodular treatment, and the first-stage, succeeding-step nodular treatment is a first-stage nodular treatment which is performed during the first-stage nodular treatment after the first-stage, preceding-step nodular treatment. In the present invention, the first-stage, preceding-step nodular treatment and the first-stage, succeeding-step nodular treatment are common to each other in that the two are performed in the same first-stage nodular treatment solution, but differ in the point of electrolysis conditions, as will be described later.

The first-stage, preceding-step nodular treatment and the first-stage, succeeding-step nodular treatment during the first-stage nodular treatment can be distinguished from each other. For example, by the fact that as an anode facing to a rough surface of an untreated copper foil in the first-stage nodular treatment solution, two kinds of anodes, i.e., an anode for the first-stage, preceding-step nodular treatment (herein after called "the first-stage, preceding-step anode") and an anode for the first-stage, succeeding-step nodular treatment (herein after called "the first-stage, succeeding-step anode") are used and that the first-stage, preceding-step nodular treatment is first performed by using the first-stage, preceding-step anode for an untreated copper foil and thereafter, the first-stage, succeeding-step nodular treatment is performed by using the first-stage, succeeding-step anode.

In the first-stage nodular treatment, the solution temperature of the first-stage nodular treatment solution during electrolysis is usually in the range from 20° C. to 40° C., preferably in the range from 25° C. to 35° C.

During the first-stage nodular treatment, the current density of the first-stage, preceding-step nodular treatment are usually in the range from 15 A/dm$^2$ to 30 A/dm$^2$ preferably in the range from 17 A/dm$^2$ to 27 A/dm$^2$, and more preferably in the range from 19 A/dm$^2$ to 25 A/dm$^2$.

The electrolysis time of the first-stage, preceding-step nodular treatment is usually for 2 seconds to 10 seconds, preferably 3 for seconds to 7 seconds, and more preferably for 4 seconds to 5 seconds.

During the first-stage nodular treatment, the current density of the first-stage, succeeding-step nodular treatment is usually in the range from 3 A/dm$^2$ to 10 A/dm$^2$, preferably in the range from 5 A/dm$^2$ to 7 A/dm$^2$.

The electrolysis time of the first-stage, succeeding-step nodular treatment is usually for 2 seconds to 10 seconds, preferably for 3 seconds to 7 seconds, and more preferably for 4 seconds to 5 seconds.

When the above-described first-stage nodular treatment is performed, copper micro-particles are formed on the rough surface side of the untreated copper foil, whereby the rough surface of the untreated copper foil is subjected to the nodular treatment. Incidentally, it is recommended to pickle the untreated copper foil appropriately with dilute sulfuric acid before the above-described the first-stage nodular treatment is performed, then copper micro-particles are formed on the surface of the rough surface side of the untreated copper foil without unevenness and uniformly.

In the present invention, if after the above-described first-stage nodular treatment, a second-stage nodular treatment what is called seal plating, which involves strongly bonding the copper micro-particles to the rough surface side of the untreated copper foil and causing the copper micro-particles to grow to some extent, was performed, it enables to prevent the copper micro-particles formed by the first-stage nodular treatment from dropping off. Therefore, this is recommended. This second-stage nodular treatment is not especially limited so long as it can prevent the dropping off of copper micro-particles. However, if the second-stage nodular treatment is performed by using a specific second-stage nodular treatment solution under specific electrolysis conditions, it enables to sufficiently prevent the dropping off of the copper micro-particles formed in the first-stage nodular treatment. Therefore, this is recommended. Incidentally, if the copper foil after finishing of the first-stage nodular treatment is rinsed with water and the like before the second-stage nodular treatment, it enables to reduce the possibility that the first-stage nodular treatment solution mixes into the second-stage nodular treatment solution. Therefore, this is recommended.

In the second-stage nodular treatment solution used in the present invention, the Cu (II) ion concentration is usually in the range from 50 g/l to 80 g/l, preferably in the range from 60 g/l to 70 g/l.

In the second-stage nodular treatment solution used in the present invention, the free $SO_4^{2-}$ ion concentration is usually in the range from 50 g/l to 150 g/l, preferably in the range from 80 g/l to 100 g/l.

In the second-stage nodular treatment solution used in the present invention, the Cl ion concentration is usually not more than 10 mg/l, preferably not more than 5 mg/l, and more preferably not more than 1 mg/l.

In the present invention, the second-stage nodular treatment is performed in such a manner that electrolysis is performed by using the above-described second-stage nodular treatment solution. The rough surface of the copper foil on which copper micro-particles were formed in the first-stage nodular treatment is served as a cathode and the CU (II) ions in the second-stage nodular treatment solution are electrodeposited, whereby the above-described copper micro-particles are seal plated.

In the present invention, the second-stage nodular treatment is such that in the above-described second-stage nodular treatment solution, a second-stage, preceding-step nodular treatment during the second-stage nodular treatment and a second-stage, succeeding-step nodular treatment during the second-stage nodular treatment are performed in succession. The second-stage, preceding-step nodular treatment is a second-stage nodular treatment which is first performed during the second-stage nodular treatment, and the second-stage, succeeding-step nodular treatment is a second-stage nodular treatment which is performed during the second-stage nodular treatment after the second-stage, preceding-step nodular treatment. In the present invention, the second-stage, preceding-step nodular treatment and the second-stage, succeeding-step nodular treatment are common to each other in that the two are performed in the same second-stage nodular treatment solution.

Incidentally, the second-stage, preceding-step nodular treatment and the second-stage, succeeding-step nodular treatment do not need to differ in the point of electrolysis conditions like the difference in the first-stage, preceding-step nodular treatment and the first-stage, succeeding-step nodular treatment in the first-stage nodular treatment, and the electrolysis conditions may be either different or the same.

The second-stage, preceding-step nodular treatment and the second-stage, succeeding-step nodular treatment during the second-stage nodular treatment can be distinguished from each other. For example, by the fact that as an anode facing to the rough surface of the copper foil on which copper micro-particles were formed by the first-stage nodular treatment in the second-stage nodular treatment solution, two kinds of anodes, i.e., an anode for the second-stage, preceding-step nodular treatment (herein after called "the second-stage, preceding-step anode") and an anode for the second-stage, succeeding-step nodular treatment (herein after called "the second-stage, succeeding-step anode") are used and that the second-stage, preceding-step nodular treatment is first performed by using the second-stage, preceding-step anode for the copper foil on which copper micro-particles were formed by the first-stage nodular treatment and thereafter, the second-stage, succeeding-step nodular treatment is performed by using the second-stage, succeeding-step anode.

In the second-stage nodular treatment, the solution temperature of the second-stage nodular treatment solution during electrolysis is usually in the range from 40° C. to 60° C., preferably in the range from 45° C. to 50° C.

During the second-stage nodular treatment, the current density of the second-stage, preceding-step nodular treatment is usually in the range from 10 A/dm$^2$ to 30 A/dm$^2$, preferably in the range from 12 A/dm$^2$ to 25 A/dm$^2$, and more preferably in the range from 15 A/dm$^2$ to 19 A/dm$^2$.

The electrolysis time of the second-stage, preceding-step nodular treatment is usually for 2 seconds to 10 seconds, preferably for 3 seconds to 7 seconds, and more preferably for 4 seconds to 5 seconds.

During the second-stage nodular treatment, the current density and electrolysis time of the second-stage, succeeding-step nodular treatment can be in the same ranges as in the second-stage, preceding-step nodular treatment. When the above-described second-stage nodular treatment is performed, the copper micro-particles formed by the first-stage nodular treatment are seal plated and it becomes easy to prevent the dropping off of the copper micro-particles.

The above-described copper foil related to the present invention and the method of manufacturing the copper foil can be used in surface-treated copper foil and the like which are to be bonded to other kinds of materials, such as a prepreg, for example, in the fabrication of printed wiring boards and the like.

Embodiments will be described below. However, the present invention shall not be construed by being limited to these embodiments.

EMBODIMENT 1

(Raw-Material Copper Foil Used in Surface Treatment)

A roll product of electro-deposited copper foil, which is untreated copper foil (thickness: 18 μm), was used as a raw-material copper foil for formation of a nodular surface by performing surface treatment.

(Surface Treatment Equipment Used in Surface Treatment)

Equipment which is provided with a pickling tank, a first-stage nodular treatment tank, a rinsing tank, a second-stage nodular treatment tank, a rinsing tank and a hot-air dryer and can continuously manufacture surface-treated copper foil by surface treating the above-described untreated copper foil at a constant speed was used as the surface treatment equipment.

Incidentally, in the first-stage nodular treatment tank of this equipment, an anode was arranged in a position facing to the matte surface side of the copper foil at a given distance to the copper foil. Two anodes were arranged through the moving direction of the copper foil. Out of the two anodes, the anode on the copper foil unwinding side was used as the first-stage, preceding-step nodular treatment anode, and the anode on the copper foil winding side was used as the first-stage, succeeding-step nodular treatment anode.

Also in the second-stage nodular treatment tank of the equipment, in the same way as with the first-stage nodular treatment tank, an anode was arranged in a position facing to the matte surface side of the copper foil at a given distance to the copper foil. Two anodes were arranged through the moving direction of the copper foil. Out of the two anodes, the anode on the copper foil unwinding side was used as the second-stage, preceding-step nodular treatment anode, and the anode on the copper foil winding side was used as the second-stage, succeeding-step nodular treatment anode.

The pickling tank, first-stage nodular treatment tank and second-stage nodular treatment tank of the above-described surface treatment equipment were respectively filled with a pickling treatment solution, a first-stage nodular treatment solution (first-stage nodular treatment solution A) and a second-stage nodular treatment solution (second-stage nodular treatment solution A) of the following compositions and the two rinsing tanks were filled with pure water.

(Preparation of Pickling Treatment Solution)

Dilute sulfuric acid was prepared by adding sulfuric acid to pure water.

(Preparation of First-Stage Nodular Treatment Solution)

The first-stage nodular treatment solution (first-stage nodular treatment solution A) of the following composition was prepared by adding copper sulfate pentahydrate, concentrated sulfuric acid, 9-phenylacridine and hydrochloric acid to pure water and dissolving them.

| | |
|---|---|
| Cu (II) ion concentration | 8 g/l |
| Free $SO_4^{2-}$ ion concentration | 50 g/l |
| 9-phenylacridine concentration | 150 mg/l |
| Cl ion concentration | 50 mg/l |

(Preparation of Second-Stage Nodular Treatment Solution)

The second-stage nodular treatment solution (second-stage nodular treatment solution A) of the following composition was prepared by adding copper sulfate pentahydrate and concentrated sulfuric acid to pure water and dissolving them.

| | |
|---|---|
| Cu (II) ion concentration | 65 g/l |
| Free $SO_4^{2-}$ ion concentration | 90 g/l |

The above-described untreated copper foil was continuously unwound at a constant speed by use of the above-described surface treatment equipment, and this untreated copper foil was subjected to pickling treatment, first-stage nodular treatment, rinsing, second-stage nodular treatment, rinsing, and drying treatment under the following conditions, whereby surface-treated copper foil was obtained.

(Pickling Treatment)

The untreated copper foil was immersed in the pickling treatment solution for 5 seconds.

(First-Stage Nodular Treatment)

The first-stage nodular treatment was performed by using the above-described first-stage nodular treatment solution A. The electrolysis conditions are shown in Table 1. Incidentally, the nodular treatment performed by using the first-stage, preceding-step nodular treatment anode of the above-described surface treatment equipment was called the first-stage, preceding-step nodular treatment, and the nodular treatment performed by using the first-stage, succeeding-step nodular treatment anode was called the first-stage, succeeding-step nodular treatment.

(Rinsing Treatment after First-Stage Nodular Treatment)

The copper foil after the first-stage nodular treatment was immersed in pure water for 5 seconds.

(Second-Stage Nodular Treatment)

The second-stage nodular treatment was performed by using the above-described second-stage nodular treatment solution A. The electrolysis conditions are shown in Table 2. Incidentally, the nodular treatment performed by using the second-stage, preceding-step nodular treatment anode of the above-described surface treatment equipment was called the second-stage, preceding-step nodular treatment, and the nodular treatment performed by using the second-stage, succeeding-step nodular treatment anode was called the second-stage, succeeding-step nodular treatment.

(Rinsing Treatment after Second-Stage Nodular Treatment)

The copper foil after the second-stage nodular treatment was immersed in pure water for 5 seconds.

(Drying Treatment)

The copper foil after the second-stage nodular treatment was dried by using the hot-air dryer.

For the nodular surface of the obtained surface-treated copper foil, the roughness $R_z$, three-dimensional surface area and adhesion were measured by the following methods. Also, an area coefficient C(S) is calculated from the three-dimensional surface area and the area of the measured zone of the three-dimensional surface area. The results are shown in Tables 3 and 4.

(Measuring Method of Roughness $R_z$)

The surface roughness $R_z(R_z(S))$ of the nodular surface of the obtained surface-treated copper foil (copper foil sample S) was measured by using a contact-type surface roughness meter, the tip of which is a diamond cone having a spherical top of 2 μm in diameter, (made by Kosaka Co., Limited, trade name: SEF-30D). The measuring length was 0.8 mm. $R_z$ was measured in accordance with JIS B0601, and concretely, $R_z$ represents ten-point average roughness.

(Measuring Method of Three-Dimensional Surface Area)

Color 3D profile-measurement microscope VK-9500 (laser used: violet laser of visible-light threshold wavelength of 408 nm) made by KEYENCE Japan was used. The surface area including asperities on the nodular surface of the surface-treated copper foil (three-dimensional surface area A(S)) was measured for a measuring area of square 50 μm×50 μm (measuring region area B(S): 2500 μm$^2$) included in the nodular surface of the surface-treated copper foil (copper foil sample S).

(Calculating Method of Area Coefficient)

By dividing the three-dimensional surface area A(S) of a nodular surface of the surface-treated copper foil (copper coil sample S) by the value of the measuring region area B(S) which is 2500 μm$^2$ (A(S)/B(S)), the area coefficient C(S) of the nodular surface of the copper foil sample S was found.

(Measuring Method of Adhesion)

First, a square specimen having a square shape of 100 mm×100 mm was cut from the obtained surface-treated copper foil (copper foil sample S).

Next, five FR-4 pre-pregs (glass cloth substrate impregnated with epoxy resin, thickness: 0.18 mm) were stacked, the above-described square specimen was laid on top of the pre-pregs so that the nodular surface side of the specimen face to the pre-preg side. And after that, they were pressure molded with pressure 30 kgf/cm$^2$, at 180° C. for 60 minutes. Then a single-sided copper-clad laminate, in which the nodular surface side of the square sample (copper foil sample S) and the resin side of the pre-preg are bonded to each other, was formed.

Next, a dry film was laminated to the whole surface of the single-sided copper-clad laminate on the copper foil side. Then a mask film having multiple slits with a slender rectangular shape of 0.8 mm width×100 mm length was placed on the dry film on the single-sided copper-clad laminate followed by forming a latent image in a dry film on the portion by exposing with ultra violet rays for curing. After that, a KOH aqueous solution was sprayed on the single-sided copper-clad laminate to develop, by removing the dry film resist preset in an unexposed portion.

Next, etching of the copper foil portion where the dry film resist was removed by spraying cupric chloride on the single-sided copper-clad laminate was performed. Then, the cured dry film resist portion was exfoliated by spraying a NaOH aqueous solution on this dry film resist portion. Then multiple rectangular circuits of 0.8 mm line width×100 mm length were formed on the epoxy resin board of glass cloth substrate.

Next, the single-sided copper-clad laminate was cut into separate parts, each constituting one circuit, and multiple specimens for adhesion measurement were prepared. In each of which one rectangular circuit of 0.8 mm line width×100 mm length is formed. A portion of each of the above-described specimens for adhesion measurement where several millimeters inward from one end in the longer direction thereof was bent in a direction substantially perpendicular to the longer direction of the rectangular circuit. In such a manner, the rectangular circuit becomes present on the inward side and only the substrate portion was cut, whereby a specimen for adhesion measurement to which the rectangular circuit connects and from which the substrate portion is cut off was prepared.

Next, the specimen for adhesion measurement was placed on a peel strength tester in such a manner that the rectangular circuit faces upward and fixed and the portion from which the above-described substrate portion had been cut off was pinched in a chuck of the above-described peel strength tester. Next, the chuck was pull upward at a constant speed and the rectangular circuit was peeled off from the substrate of the specimen for adhesion measurement and the peel strength was measured. A maximum value during the measurement was regarded as the adhesion value of the nodular surface of the surface-treated copper foil (copper foil sample S).

EMBODIMENT 2

Surface-treated copper foil was obtained in the same way as in Embodiment 1, with the exception that the electrolysis conditions for the first-stage nodular treatment and the second-stage nodular treatment were changed as shown in Tables 1 and 2. For the nodular surface of the obtained surface-treated copper foil, the roughness $R_z$, three-dimensional surface area and adhesion were measured and the area coefficient C(S) was calculated in the same way as in Embodiment 1. The results are shown in Tables 3 and 4.

EMBODIMENT 3

Surface-treated copper foil was obtained in the same way as in Embodiment 1, with the exception that the electrolysis conditions for the first-stage nodular treatment and the second-stage nodular treatment were changed as shown in Tables 1 and 2. For the nodular surface of the obtained surface-treated copper foil, the roughness $R_z$, three-dimensional surface area and adhesion were measured and the area coefficient C(S) was calculated in the same way as in Embodiment 1. The results are shown in Tables 3 and 4.

EMBODIMENT 4

Surface-treated copper foil was obtained in the same way as in Embodiment 1, with the exception that the electrolysis conditions for the first-stage nodular treatment and the second-stage nodular treatment were changed as shown in Tables 1 and 2. For the nodular surface of the obtained surface-treated copper foil, the roughness $R_z$, three-dimensional surface area and adhesion were measured and the area coefficient C(S) was calculated in the same way as in Embodiment 1. The results are shown in Tables 3 and 4.

EMBODIMENT 5

Surface-treated copper foil was obtained in the same way as in Embodiment 1, with the exception that the electrolysis conditions for the first-stage nodular treatment and the second-stage nodular treatment were changed as shown in Tables 1 and 2. For the nodular surface of the obtained surface-treated copper foil, the roughness $R_z$, three-dimensional surface area and adhesion were measured and the area coefficient C(S) was calculated in the same way as in Embodiment 1. The results are shown in Tables 3 and 4.

EMBODIMENT 6

Surface-treated copper foil was obtained in the same way as in Embodiment 1, with the exception that the electrolysis conditions for the first-stage nodular treatment and the second-stage nodular treatment were changed as shown in Tables 1 and 2. For the nodular surface of the obtained surface-treated copper foil, the roughness $R_z$, three-dimensional surface area and adhesion were measured and the area coefficient C(S) was calculated in the same way as in Embodiment 1. The results are shown in Tables 3 and 4.

COMPARATIVE EXAMPLE 1

A first-stage nodular treatment solution (a first-stage nodular treatment solution B) of the following composition was prepared as the first-stage nodular treatment solution. Surface-treated copper foil was obtained in the same way as in Embodiment 1, with the exception that the first-stage nodular treatment solution B was used in place of the first-stage nodular treatment solution A. And that the electrolysis conditions for the first-stage nodular treatment and the second-stage nodular treatment were changed as shown in Tables 1 and 2. For the nodular surface of the obtained surface-treated copper foil, the roughness $R_z$, three-dimensional surface area and adhesion were measured and the area coefficient C(S) was calculated in the same way as in Embodiment 1. The results are shown in Tables 3 and 4.

(Preparation of First-Stage Nodular Treatment Solution)

The first-stage nodular treatment solution (first-stage nodular treatment solution B) of the following composition was prepared by adding copper sulfate pentahydrate and concentrated sulfuric acid to pure water and dissolving them.

| | |
|---|---|
| Cu (II) ion concentration | 14 g/l |
| Free $SO_4^{2-}$ ion concentration | 95 g/l |

COMPARATIVE EXAMPLE 2

Surface-treated copper foil was obtained in the same way as in Embodiment 1, with the exception that the above-described first-stage nodular treatment solution B was used as the first-stage nodular treatment solution, and that the electrolysis conditions for the first-stage nodular treatment and the second-stage nodular treatment were changed as shown in Tables 1 and 2. For the nodular surface of the obtained surface-treated copper foil, the roughness $R_z$, three-dimensional surface area and adhesion were measured and the area coefficient C(S) was calculated in the same way as in Embodiment 1. The results are shown in Tables 3 and 4.

COMPARATIVE EXAMPLE 3

Surface-treated copper foil was obtained in the same way as in Embodiment 1, with the exception that the above-described first-stage nodular treatment solution B was used as the first-stage nodular treatment solution, and that the electrolysis conditions for the first-stage nodular treatment and the second-stage nodular treatment were changed as shown in Tables 1 and 2. For the nodular surface of the obtained surface-treated copper foil, the roughness $R_z$, three-dimensional surface area and adhesion were measured and the area coefficient C(S) was calculated in the same way as in Embodiment 1. The results are shown in Tables 3 and 4.

COMPARATIVE EXAMPLE 4

Surface-treated copper foil was obtained in the same way as in Embodiment 1, with the exception that the above-described first-stage nodular treatment solution B was used as the first-stage nodular treatment solution, and that the electrolysis conditions for the first-stage nodular treatment and the second-stage nodular treatment were changed as shown in Tables 1 and 2. For the nodular surface of the obtained surface-treated copper foil, the roughness $R_z$, three-dimensional surface area and adhesion were measured and the area coefficient C(S) was calculated in the same way as in Embodiment 1. The results are shown in Tables 3 and 4.

COMPARATIVE EXAMPLE 5

Surface-treated copper foil was obtained in the same way as in Embodiment 1, with the exception that the above-described first-stage nodular treatment solution B was used as the first-stage nodular treatment solution, and that the electrolysis conditions for the first-stage nodular treatment and the second-stage nodular treatment were changed as shown in Tables 1 and 2. For the nodular surface of the obtained surface-treated copper foil, the roughness $R_z$, three-dimensional surface area and adhesion were measured and the area coefficient C(S) was calculated in the same way as in Embodiment 1. The results are shown in Tables 3 and 4.

TABLE 1

| | First-stage nodular treatment | | | | | |
|---|---|---|---|---|---|---|
| | | | First-stage, preceding-step | | First-stage, succeeding-step | |
| | Solution | | Current | | Current | |
| | Type | Temperature (°C.) | density (A/dm²) | Time (sec) | density (A/dm²) | Time (sec) |
| Embodiment 1 | A | 30 | 25 | 5 | 7 | 5 |
| Embodiment 2 | A | 30 | 25 | 4 | 7 | 4 |
| Embodiment 3 | A | 30 | 22 | 5 | 6 | 5 |
| Embodiment 4 | A | 30 | 22 | 4 | 6 | 4 |
| Embodiment 5 | A | 30 | 19 | 5 | 5 | 5 |
| Embodiment 6 | A | 30 | 19 | 4 | 5 | 4 |
| Comparative Example 1 | B | 30 | 35 | 5 | 7 | 5 |
| Comparative Example 2 | B | 30 | 29 | 5 | 7 | 5 |
| Comparative Example 3 | B | 30 | 22 | 5 | 5 | 5 |
| Comparative Example 4 | B | 30 | 16 | 5 | 1 | 5 |
| Comparative Example 5 | B | 30 | 10 | 5 | 1 | 5 |

TABLE 2

| | Second-stage nodular treatment | | | | | |
|---|---|---|---|---|---|---|
| | | | Second-stage, preceding-step | | Second-stage, succeeding-step | |
| | Solution | | Current | | Current | |
| | Type | Temperature (°C.) | density (A/dm²) | Time (sec) | density (A/dm²) | Time (sec) |
| Embodiment 1 | A | 48 | 19 | 5 | 19 | 5 |
| Embodiment 2 | A | 48 | 19 | 4 | 19 | 4 |
| Embodiment 3 | A | 48 | 17 | 5 | 17 | 5 |
| Embodiment 4 | A | 48 | 17 | 4 | 17 | 4 |

TABLE 2-continued

<table>
<tr><th colspan="6">Second-stage nodular treatment</th></tr>
<tr><th></th><th colspan="2"></th><th colspan="2">Second-stage, preceding-step</th><th colspan="2">Second-stage, succeeding-step</th></tr>
<tr><th></th><th>Solution</th><th></th><th>Current</th><th></th><th>Current</th><th></th></tr>
<tr><th></th><th>Type</th><th>Temperature (° C.)</th><th>density (A/dm²)</th><th>Time (sec)</th><th>density (A/dm²)</th><th>Time (sec)</th></tr>
<tr><td>Embodiment 5</td><td>A</td><td>48</td><td>15</td><td>5</td><td>15</td><td>5</td></tr>
<tr><td>Embodiment 6</td><td>A</td><td>48</td><td>15</td><td>4</td><td>15</td><td>4</td></tr>
<tr><td>Comparative Example 1</td><td>A</td><td>48</td><td>21</td><td>5</td><td>21</td><td>5</td></tr>
<tr><td>Comparative Example 2</td><td>A</td><td>48</td><td>21</td><td>5</td><td>21</td><td>5</td></tr>
<tr><td>Comparative Example 3</td><td>A</td><td>48</td><td>14</td><td>5</td><td>14</td><td>5</td></tr>
<tr><td>Comparative Example 4</td><td>A</td><td>48</td><td>8</td><td>5</td><td>8</td><td>5</td></tr>
<tr><td>Comparative Example 5</td><td>A</td><td>48</td><td>5</td><td>5</td><td>5</td><td>5</td></tr>
</table>

TABLE 3

| | $R_z$ (μm) | Area coefficient (C(S)) | Adhesion (P(S)) (kgf/cm) |
|---|---|---|---|
| Embodiment 1 | 2.40 | 1.81 | 1.23 |
| Embodiment 2 | 2.40 | 1.74 | 1.11 |
| Embodiment 3 | 2.32 | 1.79 | 1.07 |
| Embodiment 4 | 2.15 | 1.70 | 1.05 |
| Embodiment 5 | 2.18 | 1.78 | 1.07 |
| Embodiment 6 | 2.05 | 1.53 | 1.06 |
| Comparative Example 1 | 3.36 | 2.08 | 1.14 |
| Comparative Example 2 | 3.02 | 1.81 | 1.11 |
| Comparative Example 3 | 2.22 | 1.54 | 0.95 |
| Comparative Example 4 | 1.80 | 1.22 | 0.68 |
| Comparative Example 5 | 1.59 | 1.14 | 0.45 |

TABLE 4

| | Rz (μm) | $D_1(S)$ *1 | $D_2(S)$ *2 | $D_3(S)$ *3 | C(S) | Does it satisfy $D_1(S) \leq C(S)$? *4 |
|---|---|---|---|---|---|---|
| Embodiment 1 | 2.40 | 1.70 | 2.20 | 1.90 | 1.81 | ☐ |
| Embodiment 2 | 2.40 | 1.70 | 2.20 | 1.90 | 1.74 | ☐ |
| Embodiment 3 | 2.32 | 1.66 | 2.16 | 1.86 | 1.79 | ☐ |
| Embodiment 4 | 2.15 | 1.58 | 2.08 | 1.78 | 1.70 | ☐ |
| Embodiment 5 | 2.18 | 1.59 | 2.09 | 1.79 | 1.78 | ☐ |
| Embodiment 6 | 2.05 | 1.53 | 2.03 | 1.73 | 1.53 | ☐ |
| Comparative Example 1 | 3.36 | 2.18 | 2.68 | 2.38 | 2.08 | x |
| Comparative Example 2 | 3.02 | 2.01 | 2.51 | 2.21 | 1.81 | x |
| Comparative Example 3 | 2.22 | 1.61 | 2.11 | 1.81 | 1.54 | x |
| Comparative Example 4 | 1.80 | 1.40 | 1.90 | 1.60 | 1.22 | x |
| Comparative Example 5 | 1.59 | 1.30 | 1.80 | 1.50 | 1.14 | x |

*1 Roughness coefficient $D_1(S)$: Numerical value found from $0.5 \times R_z(S) + 0.5$
*2 Roughness coefficient $D_2(S)$: Numerical value found from $0.5 \times R_z(S) + 1.0$
*3 Roughness coefficient $D_3(S)$: Numerical value found from $0.5 \times R_z(S) + 0.7$
*4 ☐: Yes x: no FIG. 1 shows the relationship between the area coefficient C(S) and $R_z$ in Embodiments 1 to 6 and in Comparative Examples 1 to 5. FIG. 1 is a graph of the relationship between the area coefficient C(S) and $R_z$ in Embodiments 1 to 6 and in Comparative Examples 1 to 5, with the ordinate representing the area coefficient C(S) and the abscissa representing $R_z$ (μm). In FIG. 1, the symbol A indicates a straight line calculated by the collinear approximation of the group of Embodiments 1 to 6 (herein after also called "Group A"), and this straight line is expressed by equation (7) below. In FIG. 1, the symbol B indicates a straight line calculated by the collinear approximation of the group of Comparative Examples 1 to 5 (herein after also called "Group B"), and this straight line is expressed by equation (8) below. In FIG. 1, the symbol C indicates a straight line expressed by equation (4) above.

[Formula 9]

$$C(S) = 0.5475 \times R_z(S) + 0.4951 \qquad (7)$$

(where C(S) is the area coefficient of the copper foil sample S, and $R_z(S)$ is the roughness (μm) of the copper foil sample S measured by using a stylus-type roughness meter.)

[Formula 10]

$$C(S) = 0.5114 \times R_z(S) + 0.3314 \qquad (8)$$

(where C(S) is the area coefficient of the copper foil sample S, and $R_z(S)$ is the roughness (μm) of the copper foil samples measured by using a stylus-type roughness meter.)

Incidentally, in FIG. 1, the straight line A is expressed by equation (7) above and hence is at the same level with the straight line C or above the straight line C in the $R_z(S)$ range of 1.0 μm to 3.0 μm and also each point of Group A satisfies the relationship of equation (1) above. On the other hand, in FIG. 1, the straight line B is expressed by equation (8) above and hence is below the straight line C in the $R_z(S)$ range of 1.0 μm to 3.0 μm and each point of Group B does not satisfy the relationship of equation (1) above.

FIG. 2 is a graph of the relationship between the adhesion and the area coefficient C(S) in Embodiments 1 to 6 and Comparative Examples 1 to 5, with the ordinate representing the adhesion (kgf/cm) and the abscissa representing the area coefficient C(S).

FIG. 3 is a graph of the relationship between the adhesion and $R_z$ in Embodiments 1 to 6 and Comparative Examples 1 to 5, with the ordinate representing the adhesion (kgf/cm) and the abscissa representing $R_z$ (μm).

<Confirmation of Effect of the Present Invention in Copper Foil Related to the Invention>

From Tables 3 and 4, the group of Embodiments 1 to 6, in which the first-stage nodular treatment was performed by using the first-stage nodular treatment solution A (Group A), satisfies the relationship of $D_1(S)$ (roughness coefficient)≦C(S) (area coefficient), and even in the case of low roughness, such as $R_z$ of 2.05 μm to 2.40 μm, the adhesion P(S) is 1.05 kgf/cm to 1.23 kgf/cm and sufficiently high.

In contrast to this, the group of Comparative Examples 1 to 5, in which the first-stage nodular treatment was performed by using the first-stage nodular treatment solution B (Group B), does not satisfy the relationship of $D_1(S)$ (roughness coefficient)≦C(S) (area coefficient), and even in the case of high roughness, such as $R_z$ of 3.36 μm (Comparative Example 1) and 3.02 μm (Comparative Example 2), the adhesion P(S) is of the order of 1.14 kgf/cm (Comparative Example 1) and 1.11 kgf/cm (Comparative Example 2). Thus, the adhesion P(S) is almost at the same level with Group A although $R_z$ is higher than Group A.

That is, it is apparent that when the adhesion P(S) is almost at the same level, it enables the surface-treated copper foil of Group A to have lower $R_z$ than the surface-treated copper foil of Group B. This can be easily understood also from the fact that FIG. 3 shows that when the adhesion P(S) is almost at the same level, the group of plots of the surface-treated copper foil of Group A shift toward the direction of lower roughness than the group of plots of the surface-treated copper foil of Group B. Incidentally, from FIG. 2 it is apparent that there is a strong correlation between the adhesion (kgf/cm) and the area coefficient C(S).

INDUSTRIAL APPLICABILITY

The copper foil related to the present invention and the method of manufacturing the copper foil can be used in surface-treated copper foil of low roughness used as a raw material for manufacturing printed wiring boards and the like and in the manufacture of this surface-treated copper foil.

DESCRIPTIONS ON FIGURES

Figure 1:
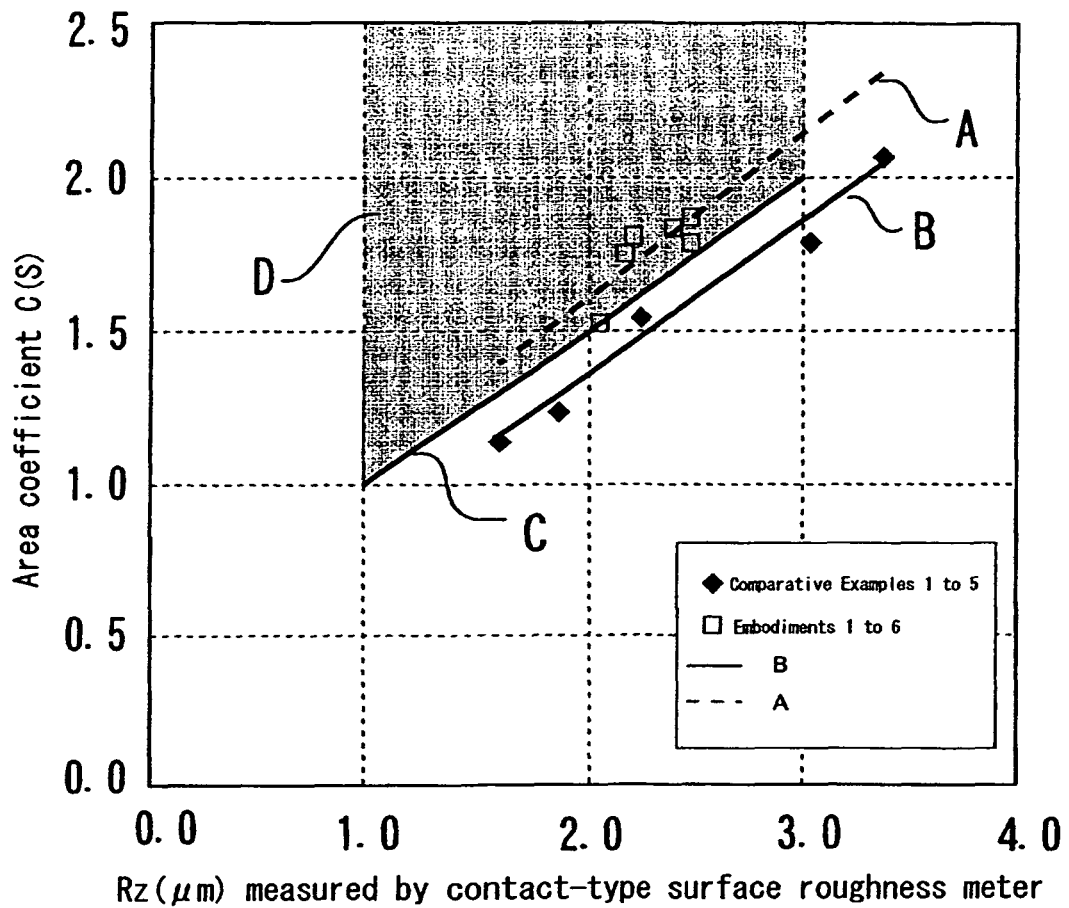

FIG. 1 is a graph which shows the relationship between the area coefficient C(S) and $R_z$ in Embodiments 1 to 6 and Comparative Examples 1 to 5, the ordinate representing the area coefficient C(S) and the abscissa representing $R_z$ (μm).

Figure 2:
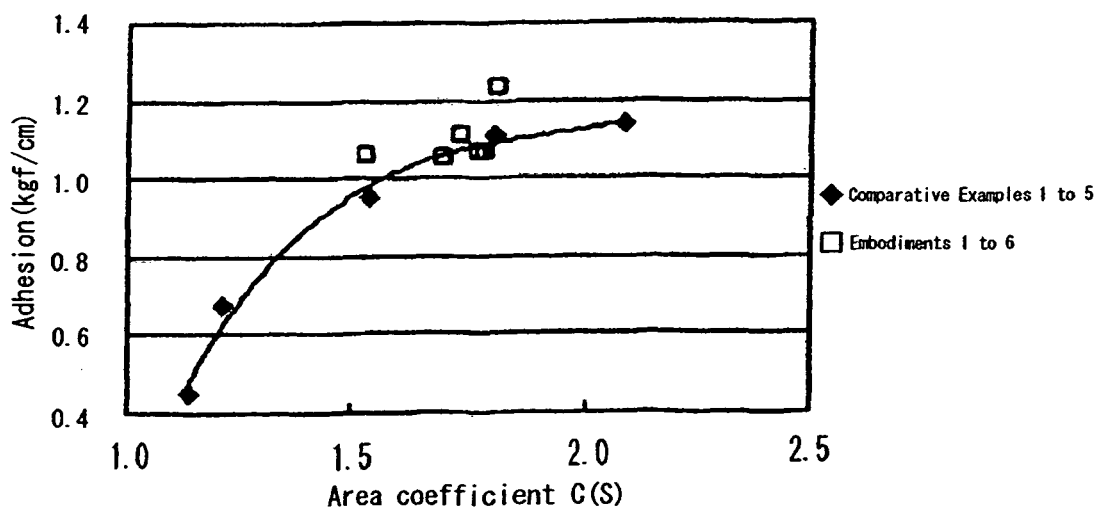
FIG. 2 shows the relationship between the adhesion and the area coefficient C(S) in Embodiments 1 to 6 and Comparative Examples 1 to 5.
Figure 3:
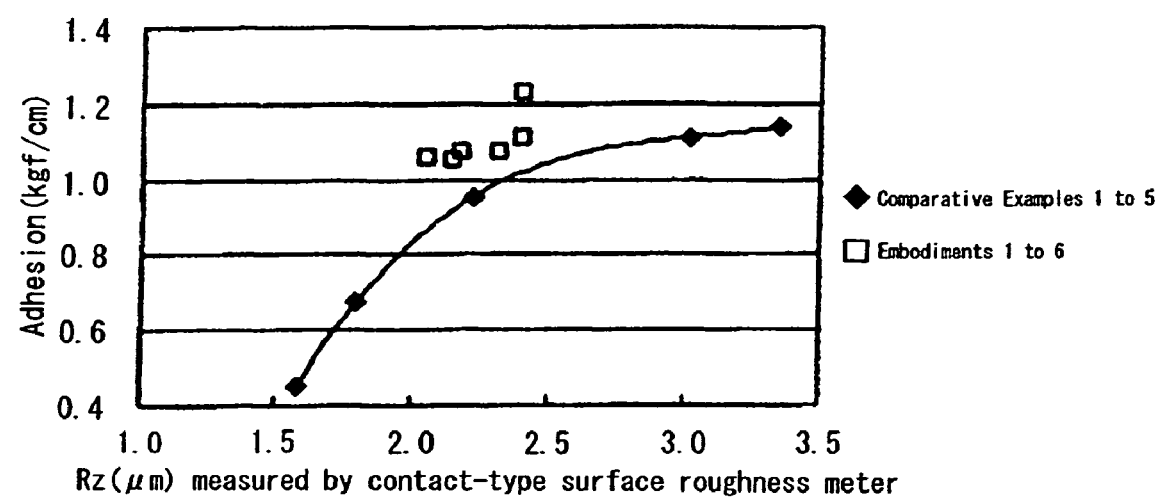
FIG. 3 shows the relationship between the adhesion and $R_z$ in Embodiments 1 to 6 and Comparative Examples 1 to 5.

FIG. 2 is a graph which shows the relationship between the adhesion and area coefficient C(S) in Embodiments 1 to 6 and Comparative Examples 1 to 5, the ordinate representing the adhesion (kgf/cm) and the abscissa representing the area coefficient C(S).

FIG. 3 is a graph which shows the relationship between the adhesion and $R_z$ in Embodiments 1 to 6 and Comparative Examples 1 to 5, the ordinate representing the adhesion (kgf/cm) and the abscissa representing $R_z$ (μm).

The invention claimed is:

1. A copper foil which is characterized in that an area coefficient C(S), which is defined by A(S)/B(S) from a three-dimensional surface area A(S), which is obtained by performing three-dimensional measurement of a surface area of a nodular surface of a copper foil sample S under a laser microscope, and from a measuring region area B(S), which is an area of a measuring region of the three-dimensional surface area A(S), and a roughness $R_z(S)$ of a nodular surface of the copper foil sample S, which is measured by a stylus-type roughness meter, have a relationship of equation (1) below, and in that the roughness $R_z(S)$ is 1.0 μm to 3.0 μm,

[Formula 1]
$$0.5 \times R_z(S) + 0.5 \leq C(S) \tag{1}$$

where $R_z(S)$ is a numerical value represented by μm.

2. The copper foil according to claim 1, which is characterized in that the copper foil sample S is a copper foil having a thickness of not more than 18 μm.

3. A method of manufacturing copper foil, which is characterized in that using untreated copper foil which has roughness $R_z$ of a matte surface of 1.0 μm to 5.0 μm as measured by a stylus-type roughness meter, a first-stage nodular treatment for nodular treatment which involves forming copper microparticles on the matte surface of the untreated copper foil is performed in a first-stage nodular treatment solution having Cu (II) ion concentrations of in the range from 5 g/l to 20 g/l, free $SO_4^{2-}$ ion concentrations of in the range from 30 g/l to 100 g/l, 9-phenylacridine concentrations of in the range from 100 mg/l to 200 mg/l and Cl ion concentrations of in the range from 20 mg/l to 100 mg/l, in that a first-stage, preceding-step nodular treatment during the first-stage nodular treatment is performed by performing electrolysis at current densities of in the range from 15 A/dm² to 30 A/dm² for 2 seconds to 10 seconds in the first-stage nodular treatment solution at solution temperatures of in the range from 20° C. to 40° C., and further in that a first-stage, succeeding-step nodular treatment during the first-stage nodular treatment is performed by performing electrolysis at current density of in the range from 3 A/dm² to 10 A/dm² for 2 seconds to 10 seconds.

* * * * *